United States Patent
Koga et al.

(10) Patent No.: US 6,822,353 B2
(45) Date of Patent: Nov. 23, 2004

(54) COOLING APPARATUS FOR ELECTRIC MOTOR CONTROL UNIT

(75) Inventors: Kiyotaka Koga, Anjo (JP); Masayuki Takenaka, Anjo (JP)

(73) Assignee: Aisin Aw Co., Ltd., Anjo (JP)

( * ) Notice: Subject to any disclaimer, the term of this patent is extended or adjusted under 35 U.S.C. 154(b) by 0 days.

(21) Appl. No.: 10/475,148

(22) PCT Filed: Dec. 26, 2002

(86) PCT No.: PCT/JP02/13585
§ 371 (c)(1),
(2), (4) Date: Oct. 17, 2003

(87) PCT Pub. No.: WO03/056687
PCT Pub. Date: Jul. 10, 2003

(65) Prior Publication Data
US 2004/0150271 A1 Aug. 5, 2004

(30) Foreign Application Priority Data
Dec. 27, 2001 (JP) .................................... 2001-398631

(51) Int. Cl.[7] .......................... H02K 9/22; H02K 9/02; B60L 9/18
(52) U.S. Cl. .......................................... 310/64; 310/52
(58) Field of Search .................. 310/52, 54, 58–59, 310/64, 67 R; 180/65.1, 65.8

(56) References Cited

U.S. PATENT DOCUMENTS

| | | | | |
|---|---|---|---|---|
| 4,963,776 A | * | 10/1990 | Kitamura ..................... 310/64 |
| 5,006,744 A | * | 4/1991 | Archer et al. ................. 310/89 |
| 5,411,199 A | * | 5/1995 | Suppelsa et al. ......... 228/179.1 |
| 5,825,107 A | * | 10/1998 | Johnson et al. ............... 310/64 |
| 6,039,114 A | | 3/2000 | Becker et al. .............. 165/170 |
| 6,198,183 B1 | * | 3/2001 | Baeumel et al. ............. 310/52 |
| 6,201,365 B1 | * | 3/2001 | Hara et al. .................. 318/558 |
| 6,323,613 B1 | | 11/2001 | Hara et al. .................. 318/471 |
| 6,496,371 B2 | * | 12/2002 | Winkel et al. .............. 361/703 |

FOREIGN PATENT DOCUMENTS

| | | | | |
|---|---|---|---|---|
| JP | A 5-292703 | 11/1993 | ............ H02K/9/19 |
| JP | A 7-38025 | 2/1995 | ......... H01L/23/473 |
| JP | A 8-178569 | 7/1996 | ............. F28F/1/02 |
| JP | A 8-205461 | 8/1996 | ............ H02K/5/22 |
| JP | A 10-156462 | 6/1998 | ........... B21D/53/04 |
| JP | 10256444 A | * | 9/1998 | |
| JP | A 2001-119898 | 4/2001 | ........... H02K/11/00 |

* cited by examiner

Primary Examiner—Burton Mullins
(74) Attorney, Agent, or Firm—Oliff & Berridge, PLC (57) ABSTRACT

A cooling apparatus for an electric motor control unit includes a heat sink that contacts power modules of the unit, a concave portion continuously formed in the heat sink and a wall member mounted on an opening face side of the concave portion so as to be fixed to the sink together define a coolant passage in the heat sink. In the heat sink, a projection projects from a mounting surface with respect to the wall member, and is fitted into a hole of the wall member and fixed to the heat sink by press-fitting. Thus, fluid leakage from cavities in a thin wall portion at a bottom of a bolt, such as in the case of conventional bolting, is prevented.

20 Claims, 7 Drawing Sheets

COOLING APPARATUS FOR ELECTRIC MOTOR CONTROL UNIT

This application claims priority from JP2001-398631 filed Dec. 27, 2001, through PCT/JP02/13585 filed Dec. 26, 2002, the disclosures of both documents incorporated herein by reference.

FIELD OF THE INVENTION

The invention relates to a cooling apparatus for an electric motor control unit, and more particularly to a cooling apparatus suitable for cooling a module of an inverter, or the like, of an electric motor control unit integrated with a driving device for an electric vehicle or a driving device for a hybrid vehicle.

BACKGROUND OF THE INVENTION

A driving device for a vehicle using an electric motor as a drive source employs a structure in which a control unit having a built-in inverter or the like for controlling the electric motor is integrated with the driving device, giving the driving device an advantage in terms of handling and installation space in a vehicle. When the electric motor control unit and the driving device are integrated as such, the electric motor control unit is exposed to heat from the electric motor of the driving device in addition to heat generated from the electric motor control unit itself. Furthermore, a device, such as a driving device for a hybrid vehicle, exposed to heat generated from a combustion engine is disposed directly to a heat sink provided with a coolant passage so as to cool a power module of the electric motor control unit in particular. Japanese Patent Laid-Open Publication No. 2001-119898 discloses such a conventional structure in which a coolant passage is defined in a heat sink. In this structure, a race with a bottom, that is a surface to which a module of an electric motor control unit is mounted in close contact, is formed in the heat sink. A partition plate is attached on an opening face side of the race and the coolant passage surrounded by the race and the partition plate is formed by bolting the partition plate to fix to the heat sink.

Meanwhile, coolant leakage to the module constituting an electric motor control unit, such as above, must be avoided by all means to ensure operation of a module electronic circuit. However, in the conventional method, the thickness between a bottom portion of a bolt hole and a module mounting surface is significantly reduced by forming the bolt hole in the heat sink, which is a cast made of aluminum or the like to ensure thermal conductivity. Therefore, if there are any cavities in this portion, the bottom portion of the bolt hole and the module mounting surface may be linked through the cavities during a screw-cutting process for the bolt hole, causing fluid of the coolant passage and fluid outside the partition plate to leak to the module mounting surface through the cavities. In particular, when a finish machining process is applied to the module mounting surface to improve thermal conductivity on the module mounting surface, cavities which were not linked before may be linked by the process.

In order to prevent such leakage through the cavities, there is a method of setting the module mounting surface, to which finish machining is applied, higher than an outer surface of the bottom portion of the bolt hole so that the outer surface of the bolt hole bottom portion remains unprocessed. When such an arrangement is employed, close contact between the outer surface of the bolt hole bottom portion and the module can no longer be expected, which reduces a contact area of the machined surface of the heat sink with respect to the module. Therefore, cooling capability is inevitably lowered. In addition, there is another method in which the thickness of the bolt hole bottom portion is increased. With this method, the thickness of the entire heat sink increases, resulting in size and weight increases, which are not preferable.

SUMMARY OF THE INVENTION

It is an object of the invention to provide a cooling apparatus for an electric motor control unit capable of preventing fluid leakage from a mounting portion of a component member of a coolant passage, without increasing a thickness of the heat sink or reducing the heat exchange area.

In order to achieve aforementioned object, according to the invention, a cooling apparatus for an electric motor control unit includes a heat sink contacting modules of an electric motor control unit, a concave portion continuously formed in the heat sink, and a wall member mounted on an opening face side of the concave portion so as to be fixed to the heat sink, which defines a coolant passage in the heat sink together with the concave portion of the heat sink, wherein the heat sink includes a projection projecting from a mounting surface with respect to the wall member; the wall member includes a hole fitted into the projection; and the wall member is fixed to the heat sink by press-fitting the projection of the heat sink.

Because this structure does not require forming a thin wall portion that exceeds the thickness of a bottom portion of a race in order to fix the wall member to the heat sink, connection in the thin wall portion through cavities can be prevented. Thus, with the structure, fluid leakage to the contact portion side of the module that is generated when fixing the wall member can be prevented without increasing the thickness of the heat sink or reducing a heat exchange area.

In the aforementioned structure, it is effective to employ a structure in which the concave portion is a race that winds so as to substantially extend over an entire area of the heat sink.

Because this structure does not require providing a space for arranging a bolt hole requiring a constant thickness therearound between the races of the heat sink, the heat exchange area can be increased by densely arranging the races, thus improving the cooling efficiency of the heat sink.

In the aforementioned structure, it is effective to employ a structure in which a dividing wall, the height of which, from a bottom of the race, is shorter than a depth of the race, is provided along the race.

In this structure, the dividing wall provided along the race functions as a fin for increasing the heat exchange area and as a guide for uniformly providing a flow rate of the coolant in a race width direction, thus further improving the cooling efficiency of the heat sink.

In the aforementioned structure, it is even more effective to employ a structure in which the concave portion is structured from a space between a plurality of pin-like fins rising from a bottom portion of the heat sink.

In this structure, because a heat exchange portion contacting the coolant passage is comprised of pin-like fins with low resistance, a pressure difference at each portion in the passage becomes small. Thus, even if a flow amount of the coolant is increased, it is possible to reduce the amount of fluid leaking from the passage as the generation of a partial high-pressure portion is inhibited. In addition, the structure of the coolant passage is simplified.

In the case of the aforementioned structure, it is even more effective to employ a structure in which the plurality of pin-like fins are evenly arranged on substantially the entire surface of the heat sink.

In this structure, a pressure loss generated by the pin-like fins across the entire coolant passage is substantially uniform. Accordingly, with this structure, even if the flow amount of the coolant is increased, it is possible to further reduce the amount of fluid leaking from the passage as the partial high-pressure portion is not generated. In addition, the structure of the coolant passage can be further simplified, thus achieving an uniform cooling efficiency over the entire heat sink.

Further, the aforementioned structure can be structured such that a part of the plurality of pin-like fins have the projections at the tips thereof.

In this structure, the pin-like fins can be used as a fixing mechanism of the wall member with respect to the heat sink.

It is effective to apply each of the aforementioned structures to a structure in which a contact surface of the heat sink with the modules is a surface to which finish machining is applied.

In this structure, it is not necessary to consider the connection through cavities generated by applying the finish machining process to the thin wall portion. Therefore, the cooling efficiency can be improved by applying finish machining to the contact surface between the heat sink and the module so as to being the heat sink in closer contact with the module.

It is even more effective to apply each of the aforementioned structures to a structure in which the heat sink is fixed on a driving device case of a driving device for a vehicle, including an electric motor, at a predetermined distance to define a return passage for a coolant between the driving device case and the wall member of the heat sink.

In this structure, the coolant flowing in the heat sink used for cooling the module can be used to cool the driving device case side. In addition, because the outer side of the wall member constitutes a passage for the coolant, a special sealing mechanism for completely preventing the leakage of the coolant from the passage in the heat sink to the outer side of the wall member is not required.

BRIEF DESCRIPTION OF THE DRAWINGS

Hereafter, embodiments that employ the invention in a driving device for a hybrid vehicle will be described with reference to the accompanying drawings.

DETAILED DESCRIPTION OF THE EMBODIMENTS

The invention is effective for use extensively for cooling a general electric motor control unit, and especially effective when applied to cool an electric motor control unit of a driving device for a hybrid vehicle or a driving device for an electric vehicle.

Figure 3:
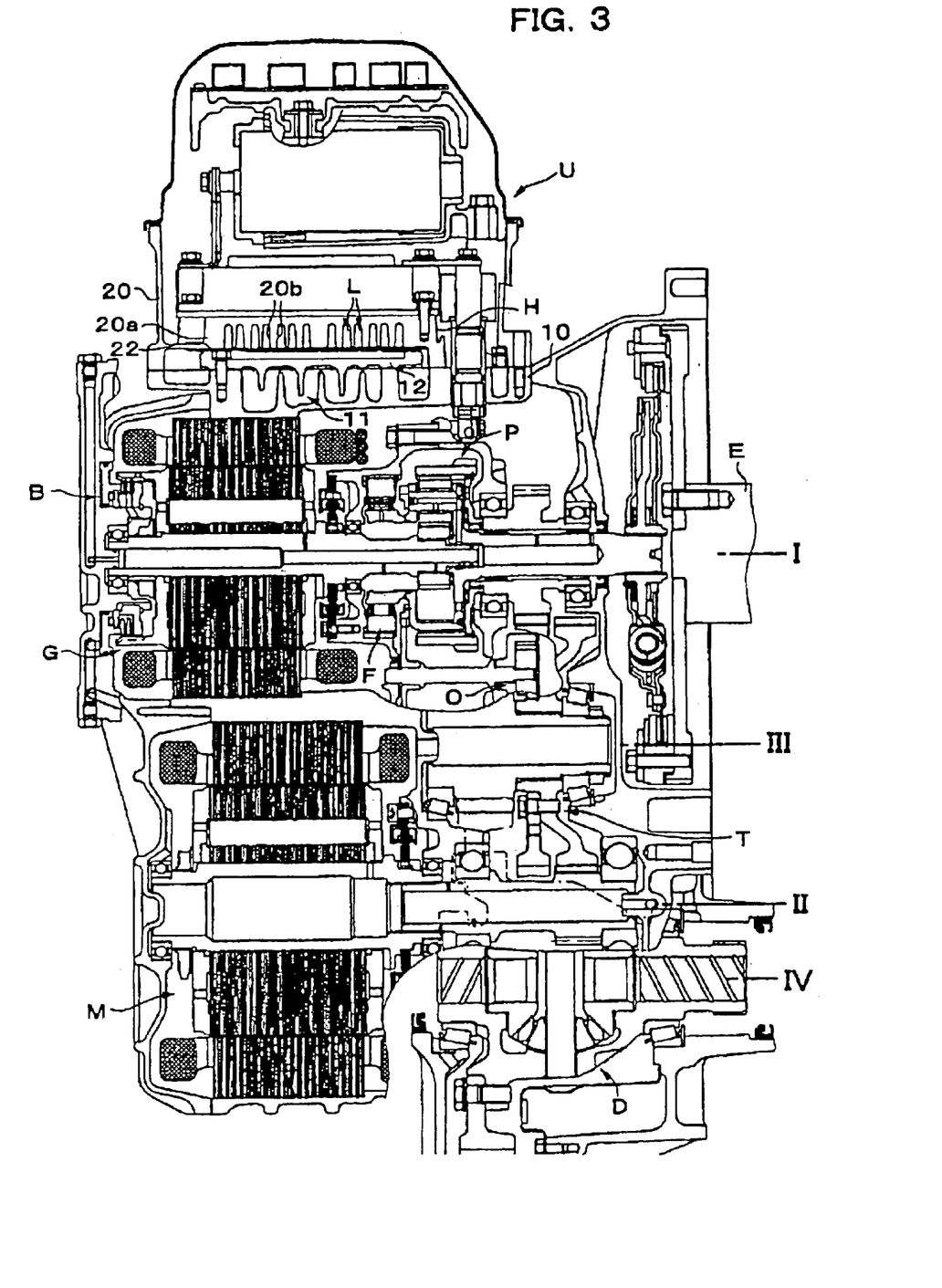
FIG. 3 is sectional development view in an axial direction of a driving device for a hybrid vehicle which applies the cooling apparatus for the electric motor control unit according to the first embodiment.

FIG. 3 is a sectional view in an axial direction of the driving device according to a first embodiment of the invention. In this embodiment, each shaft is arranged on the same plane. The driving device includes such main components as an electric generator (hereinafter referred to as "generator") G disposed on a first shaft I, an electric motor (hereinafter referred to as "motor") M disposed on a second shaft II, a differential device D disposed on a fourth shaft IV, and a planetary gear set P with a single pinion structure disposed on the first shaft I. An internal combustion engine (hereinafter referred to as "engine") E, of which only a shaft end is shown in FIG. 3, is connected to the planetary gear set P on the first shaft I. The engine E and the generator G, disposed on the same shaft, are drivingly connected with each other via the planetary gear set P and are drivingly connected with the differential device D via a counter gear mechanism T on a third shaft III. The motor M is directly connected to the differential device D via the counter gear mechanism T. In addition, a one-way-clutch F for preventing a reverse rotation of the engine E is provided opposite to a brake B for preventing a loose turning of the generator G.

Figure 4:
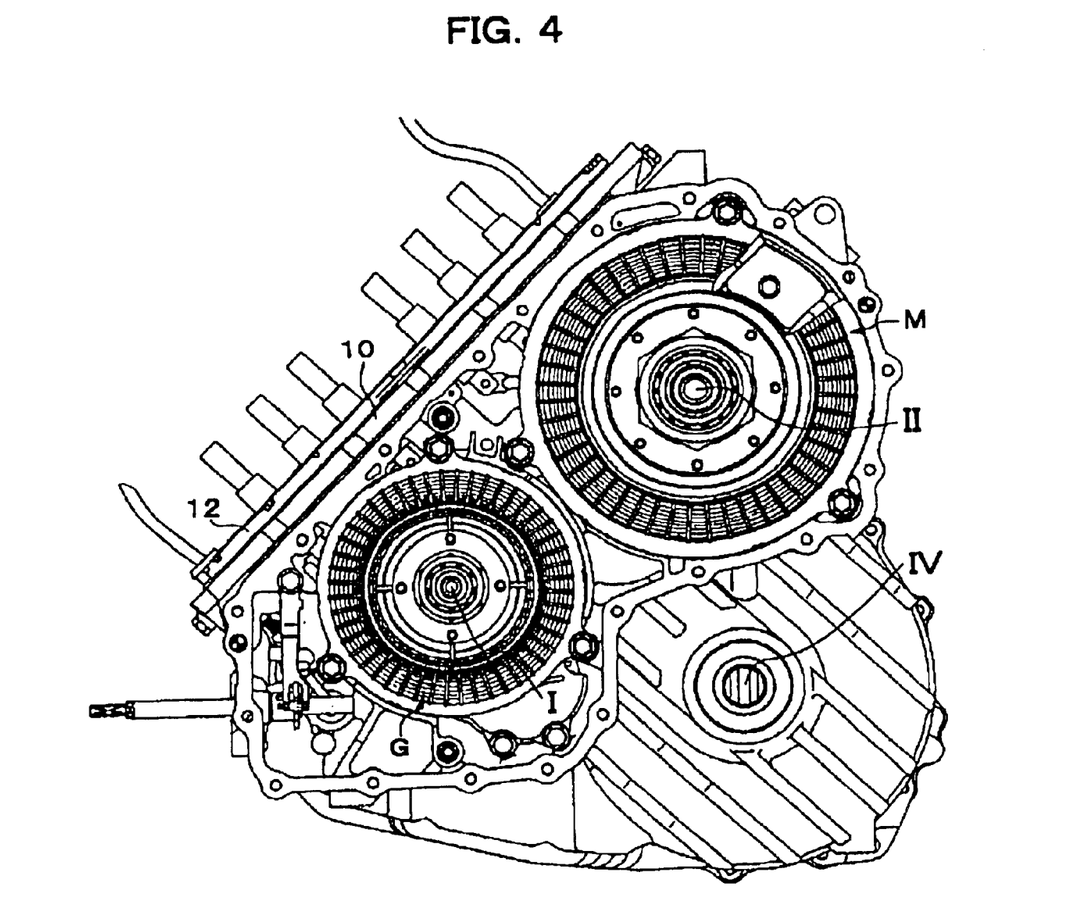
FIG. 4 is a side view showing the driving device for the hybrid vehicle with a side cover removed.

FIG. 4 is a side view showing the actual physical relationship of shafts I, II and IV with a side cover removed. In the driving device, the fourth shaft IV, disposed with the differential device D, is arranged at a lowermost position. The second shaft II, disposed with the motor M, is arranged generally above the fourth shaft IV. The first shaft I, disposed with the generator G and the like, is arranged in front of (a forward direction when the driving device is mounted in a vehicle) and slightly above the fourth shaft IV. The third shaft III is not shown in FIG. 4. However, it should be noted that the third shaft III is generally arranged at the center of the triangle formed by connecting axis centers of the first shaft I, the second shaft II, and the fourth shaft IV with a straight line.

In relation to the driving device structured as such, a control unit U is connected such that a mounting surface of the control unit U, shown in FIG. 3, is generally in contact with outer diameters of the motor M and the generator G, as shown in FIG. 4, in an attempt to reduce the overall height of the control unit U integrated with the driving device. As the height of a shaft position of the motor M is different from that of the generator G, the control unit U is mounted to a driving device case 10 such that the control unit U is slanted downwardly toward the front of the driving device.

Figure 5:
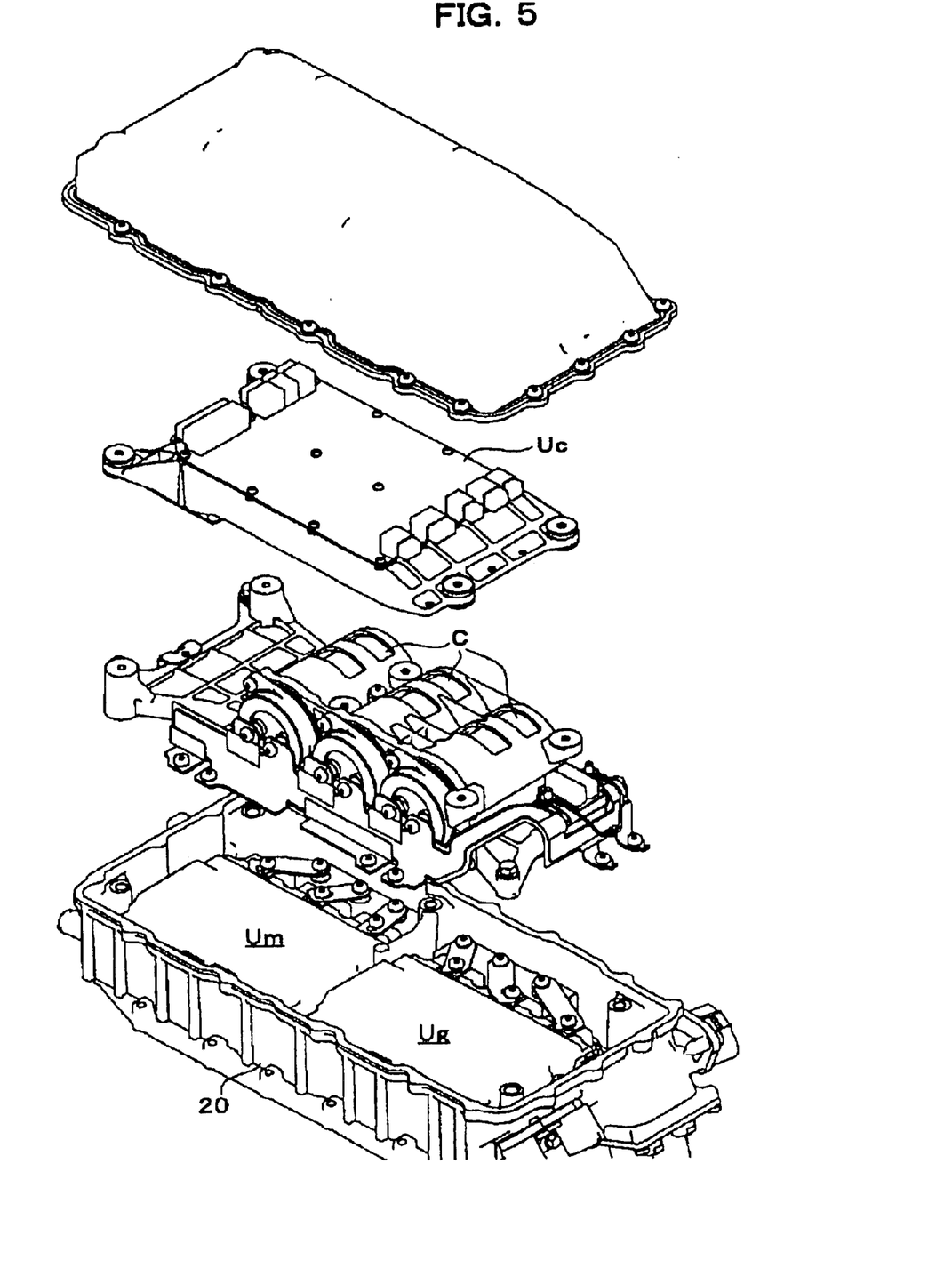
FIG. 5 is an exploded perspective view showing a control unit of the driving device for the hybrid vehicle.

The control unit U of this embodiment includes an electric motor control unit and a driving device control unit. The electric motor control unit is structured as a three-phase alternating current electric motor that drives both the motor M and the generator G using an on-board battery as a power source. Accordingly, the electric motor control unit is a power module comprising an inverter that controls the motor M and the generator G respectively, as shown in an exploded perspective view in FIG. 5. More specifically, the electric motor control unit comprises power modules Um, Ug, which are composed of a switching transistor that converts a direct current of the battery power source to an alternating current (or a three-phase alternating current, in the case of an electric motor that is a three-phase alternating current electric motor) by a switching operation as well as accompanying circuit chips, and a circuit board on which the circuit chips are arranged. Meanwhile, the driving device control unit is a control module Uc in which various chips are arranged on a circuit board. The chips constitute a memory that stores data and various programs for controlling the entire driving device, and an electronic control unit (ECU), which is mainly a microcomputer. Among each module, the power modules Um, Ug handle large electric currents and the chips thereof generate high heat. Thus, the power modules Um, Ug are arranged in a line on a bottom wall surface located at the lowest position so as to contact a heat sink H (refer to FIG. 3) provided by the bottom wall of an unit case 20, above which a condenser C for a smoothing circuit of the inverter is arranged, and the control module Uc is arranged thereabove.

Referring back to FIG. 3, the embodiment employs a method in which ATF (automatic transmission fluid, hereinafter referred to as "oil") is circulated in the driving device case 10 for lubricating each portion of the mechanism of the driving device and cooling the motor M and generator G. The oil is cooled by exchanging heat with another coolant (for example, water, antifreezing fluid, or the like), and a method in which the control unit U is integrally disposed with the driving device, which is cooled by exchanging heat with the coolant. Accordingly, a cooling apparatus is disposed at a connecting portion between the driving device and the control unit U: (The connecting portion is illustrated in FIG. 4 as a plane of a mating face with the driving device case 10 slanted down to the left.)

The cooling apparatus houses an oil reservoir 11 formed on the mating face on the driving device case 10 side, a heat transfer wall 12 with attached fin, made of material with good thermal conductivity, such as aluminum, constituting a lid to cover the oil reservoir 11, and each module of the control unit U. The cooling apparatus is structured from the heat sink H formed at a bottom wall portion 20a of the unit case 20 made of material with good thermal conductivity, such as aluminum, as well. The oil reservoir 11 on the driving device case 10 side constitutes an oil passage which is a part of an oil circulating passage. A pressure feed source for the oil circulating passage is an oil pump O drivingly connected to a carrier of the planetary gear set P. Orifices, not shown, provided on an inlet side and an outlet side of the oil passage constantly adjust the flow amount to maintain an appropriate amount of oil in reserve. The heat sink H on the unit case 20 side according to the application of the invention is connected with the power modules Um, Ug for the motor M and the generator G of the control unit U, respectively, and has a coolant passage L having a race 20b that is formed in the heat sink H, with a downside that is open and a cross-section that is U-shaped. The opening face side of the race is closed with an insulation wall 22 that serves as a wall member acting as a race lid.

Figure 1:
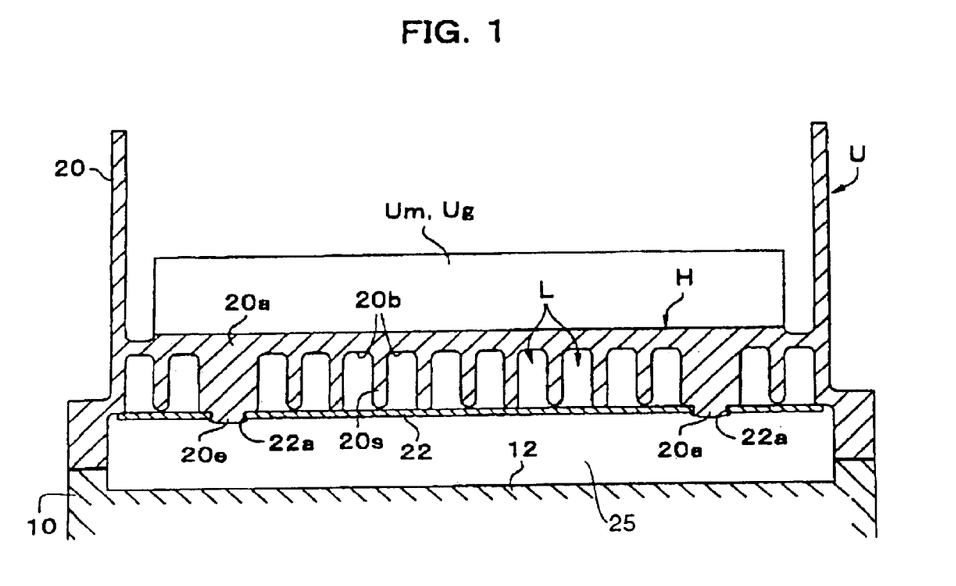
FIG. 1 is a sectional view showing a structure of a heat sink of a cooling apparatus for an electric motor control unit according to a first embodiment of the invention.

As shown in a detailed pattern diagram in FIG. 1, the heat sink H, in contact with the power modules Um, Ug for the motor M and the generator G of the control unit U, is structured such that the bottom wall 20a of the unit case 20 is raised from the mating face thereof with the driving device case 10. In the bottom wall 20a, a concave portion is continuously formed as the race 20b, the concave portion having a U-shaped cross-section. The insulation wall 22, serving as the wall member, is mounted and fixed at the opening face side of the race 20b. The insulation wall 22 defines the coolant passage L in the heat sink H together with the race 20b of the bottom wall 20a.

In accordance with the characteristics of the invention, the bottom wall 20a has projections 20e projecting from a surface to which the insulation wall 22 is attached and to which finish machining is applied. The insulation wall 22 has holes 22a fitted into the projections 20e, and is fixed to the bottom wall 20a by press-fitting the projections 20e of the bottom wall 20a. Pressing against the machined surface of the insulation wall 22 prevents leakage from portions between adjacent passages L and press-fitted portions outward from the insulation wall 22, which adversely affects cooling efficiency. In this case, in particular, when fluid leaks from the press-fitted portion outward from the insulation wall 22, the leakage becomes coolant flowing to a return flow passage 25 due to the aforementioned passage arrangement. Accordingly, a tight seal structure for preventing leakage to an outside space to the drawing device case 10 is not required.

Figure 2:
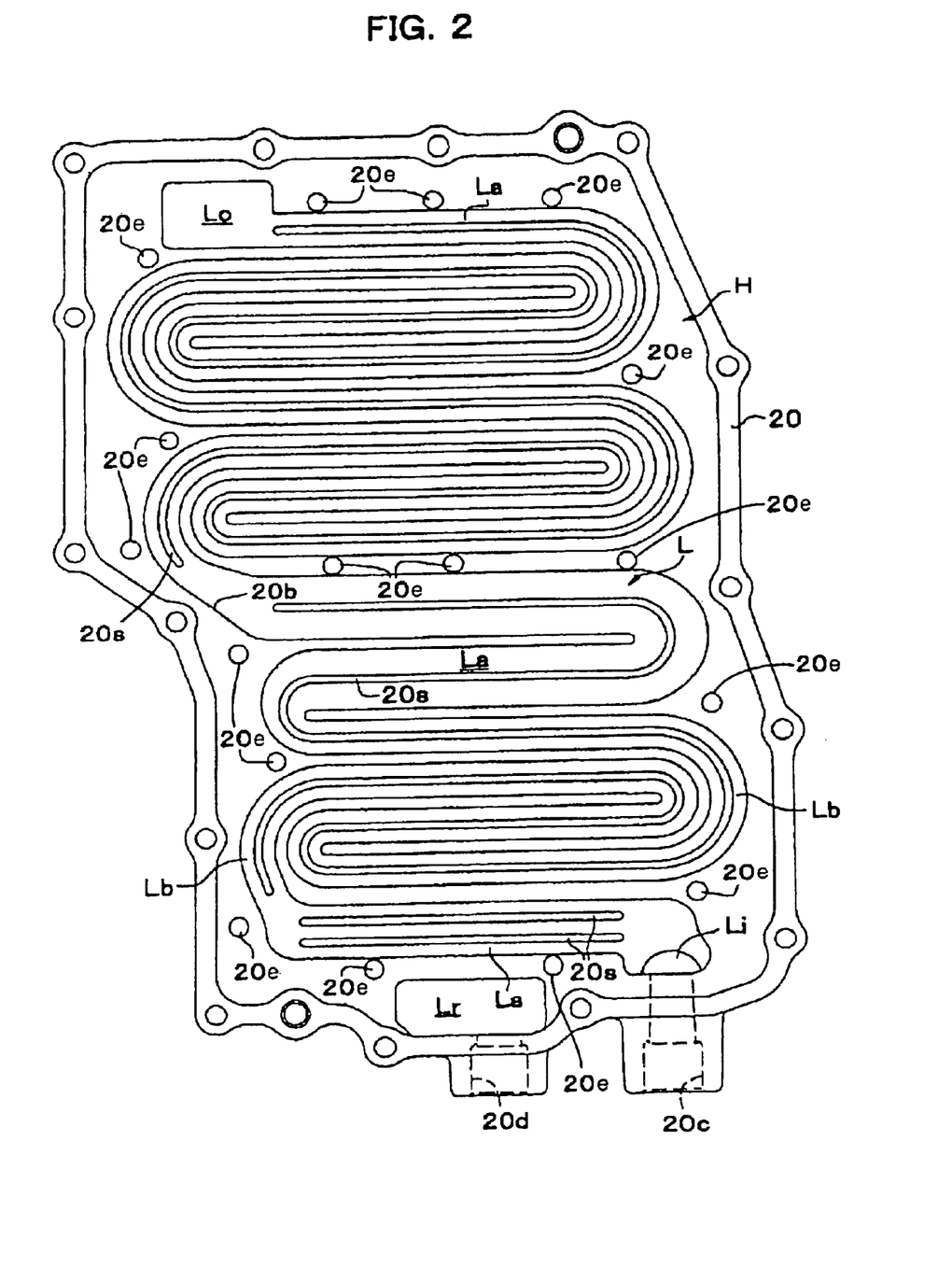
FIG. 2 is a bottom plan view showing an arrangement of a coolant passage of the heat sink in an exposed state.

As shown in the detail of the coolant passage L, shown exposed and viewed from above the heat sink H in FIG. 2, the race 20b, constituting the concave portion, winds so as to substantially extend over an entire practical area of the heat sink H. Specifically, in the coolant passage L between an inlet Li and an outlet Lo, an end portion of a linear portion La that extends in parallel communicates with another end portion of the linear portion La and with a curved portion Lb such that the coolant passage L is serpertine. The coolant passage L is disposed directly under the power module Ug for the generator and the power module Um for the motor and particularly concentrated directly under heat-generating chips of both of the power modules Um, Ug.

The inlet Li of the coolant passage L is formed on a side wall of the unit case 20 as a hole 20c penetrating the side wall. The linear portions La extending therefrom are sequentially bent with the curved portions Lb so as to form a curved passage structure, extending toward the opposite direction through a final linear portion La to reach the outlet Lo. In this embodiment, one dividing wall 20s, or two dividing walls 20s depending on the position, with a height from a bottom of the race 20b that is shorter than a depth of the race 20b is provided along the race 20b at the center thereof. It should be noted that the dividing walls 20s function as fins to increase heat exchange efficiency as well as a guide for making a flow rate of the coolant uniform in the race width direction, and do not structure a parallel passage as a whole. Therefore, edges of the dividing walls 20s are not treated with the finish machining process and do not closely contact the insulation wall 22 as shown in the cross sectional view of FIG. 1. Formed on the insulation wall 22 are a communication opening (not shown), matching the shape of the outlet Lo, and a return opening (not shown), matching the shape of a return port Lr. The return port Lr, formed on the bottom wall of the unit case 20, communicates with a return hole 20d in a peripheral wall of the unit case 20.

Coolant is force-fed to the heat sink H by an electric pump, provided separately and not shown, through an appropriate outer pipe, not shown, and the inlet hole 20c formed on the peripheral wall of the unit case 20. Immediately after fluid of a low temperature enters the coolant passage L, the fluid is lead to a portion directly under the heat-generating chips of the power module Ug for the generator and, in particular, cools the chip portions of the power module Ug for the generator by exchanging heat with a sufficient temperature gradient. Then, the fluid flows through a communication passage below, and between, the power module Ug for the generator and the power module Um for the motor to a portion directly under the heat-generating chips of the power module Um for the motor to cool the chip portions of the power module Um for the motor. The coolant then exits from the heat sink H, passes through the opening in the insulation wall 22, and runs thereunder. When the coolant flows along the mating face portion with the driving device case 10, as shown in FIG. 1, the coolant then cools the oil in the oil reservoir 11 (refer to FIG. 3) by exchanging heat with the heat transfer wall 12 with attached fins. After flowing through the mating face portion to complete the series of heat-exchange process, the coolant enters the heat sink H again from the return opening of the insulation wall 22, passes through the return hole 20d of the peripheral wall of the unit case 20, then through piping, not shown, and a heat radiation mechanism, such as a radiator for cooling an engine or an exclusive cooler, to return to a refrigerant reservoir connected to a suction side of the electric pump.

In the case of the cooling apparatus of the embodiment, the coolant is commonly used for cooling both the power modules Um, Ug and the oil. Specifically, due to the aforementioned arrangement of the coolant passage L, the coolant first cools the power modules Um, Ug through the heat sink H, then cools the oil for cooling the motor M and the generator G. With this sequence, the temperature of the coolant in the heat sink H side can be maintained lower than that on the heat transfer wall 12 side. This cooling system depends on being able to carry out high-efficiency cooling in order to generate a sufficient heat gradient between the oil that sandwiches the heat transfer wall 12, even if the coolant used has increased in temperature after passing through the heat sink H. This is because the heat resistance temperature of the power modules Um, Ug is lower than that of the motor M and the generator G, and the temperature of the oil used as the coolant for cooling the motor M and the generator G is considerably higher than the temperature of the power modules Um, Ug in a state where the high load of the motor M and the generator G requires sufficient cooling.

In addition, with the aforementioned cooling sequence, the cooling apparatus portion disposed between the driving device case 10 and the unit case 20 itself effectively functions as an insulation mechanism that prevents the heat of high temperature oil from transferring to the power modules Um, Ug between the heat sink H and the heat transfer wall 12. Accordingly, even if the oil temperature is increased during a high load, the temperature of the coolant can be prevented from exceeding the heat resistance temperature of the power modules Um, Ug. Therefore, a synergistic effect generated from the aforementioned operation makes it possible to efficiently cool the power modules Um, Ug, the motor M and the generator G in accordance with each heat resistance temperature thereof, even if the coolant is commonly used.

In relation to such an arrangement of the coolant passage L, the projections 20e, for press-fitting, which project from the bottom wall 20a are arranged such that the projections 20e generally surround the entire coolant passage L area and are further arranged in a line across the center portion of the entire coolant passage L (see FIG. 2). The arrangement of the press-fitted portion allows the insulation wall 22 to be fixed at generally constant intervals in relation to the bottom wall 20a, realizing a fixing structure with no gaps between the bottom wall 20a and the insulation wall 22. Furthermore, the press-fitted portion arranged across the center portion of the entire coolant passage L area in particular does not require increased thickness in the periphery of the press-fitted portion as in the case of a conventional bolt hole. Thus, as plainly shown in FIG. 2, the press-fitted portion is arranged at a portion between sections of the coolant passage L, the width of which is practically limited to an equivalent of a diameter of the projection 20e, without shortening the width of the coolant passage L.

As described in detail above, according to the cooling apparatus of the embodiment, it is no longer necessary to form a thin wall portion that exceeds the thickness of a bottom portion of the race 20b, previously necessary when bolts were used to fix the wall member, in order to now fix the wall member 22 to the heat sink H. Therefor, connection through openings for receiving the bolts, and possible cavities formed in the thin wall portion during manufacture, can be prevented while finish machining to the contact surface with the power modules Um, Ug is applied so as to be in close contact with the heat sink H. Accordingly, the structure can prevent fluid leakage to the contact portion side of the module generated by fixing the wall member 22 without increasing the thickness of the heat sink or reducing the heat exchange area.

Figure 6:
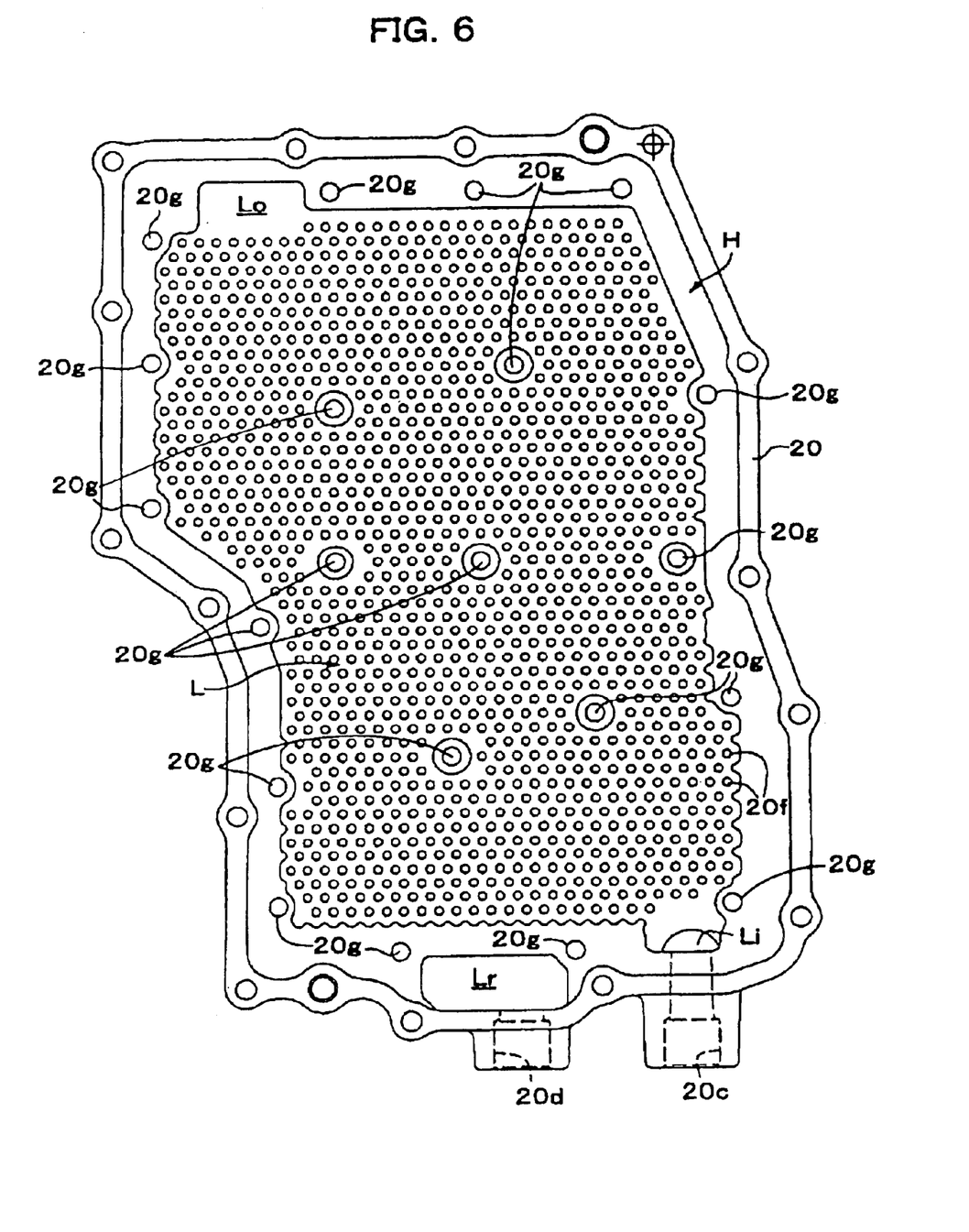
FIG. 6 is a bottom plan view showing an arrangement of a coolant passage of a heat sink in a transparent state according to a second embodiment of the invention.
Figure 7:
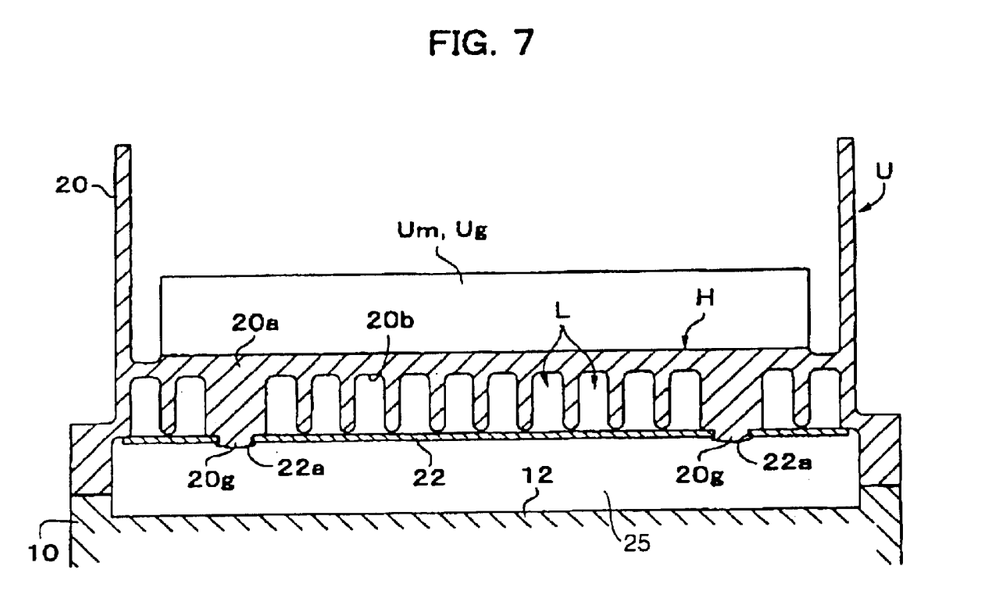
FIG. 7 is a sectional view showing a structure of the heat sink according to the second embodiment.

FIGS. 6 and 7 show a second embodiment in which the concave portion constituting the coolant passage in the heat sink according to the first embodiment is modified. Portions of the second embodiment that are identical to those of the first embodiment are represented by identical reference numerals. The description of such portions will be omitted and only points of difference will be described. In the case of this embodiment, as shown in the arrangement of the coolant passage L of the heat sink H in a viewable state in FIG.6, an entire space surrounded by the peripheral wall of the unit case 20 forms an outline of the concave portion. Spaces between a plurality of pin-like fins 20f extending from the bottom portion of the bottom wall 20a (extending downward from the bottom wall 20a in FIG. 6, i.e., only a cross section of the fins is shown) form the concave portion which functions as the coolant passage L. The plurality of pin-like fins 20f are evenly arranged over substantially the entire surface of the heat sink H in vertical and horizontal directions at a constant pitch such that the resistance of a fluid which flows in the coolant passage L is uniform in all portions of the space in the passage.

As shown in a sectional structure with a pattern diagram in FIG. 7, in this embodiment, a fixing structure of the insulation wall 22 in relation to the bottom wall 20a is structured such that a part of the plurality of pin-like fins 20f have projections 20g at the tips thereof. The projections 20g are fitted into holes 22a formed on the insulation wall 22, as is the case in the first embodiment, and press-fitted. The pin-like fins 20f for press-fitting are fins with step having a thick bottom portion so as to constitute a contact surface with the insulation wall 22.

In relation to such an arrangement of the coolant passage, the projections 20g for press-fitting which project from the bottom wall 20a are arranged such that the projections 20g generally surround the entire passage and are further arranged across the center portion of the entire passage at generally constant intervals (FIG. 6). The arrangement of the press-fitted portion allows the entire surface of the insulation wall 22 to be fixed at generally constant intervals in relation to the bottom wall 20a, realizing a fixing structure with no gaps between the bottom wall 20a and the insulation wall 22. Furthermore, in particular, the press-fitted portion itself arranged across the center portion of the entire passage functions as a cooling fin, with a diameter thereof different from that of other pin-like fins 20f.

In the structure according to the second embodiment, because a heat exchange portion contacting the coolant passage L is constituted by pin-like fins 20f with low resistance, a pressure difference at each portion in the passage becomes small. Furthermore, the pin-like fins 20f are evenly arranged over the entire coolant passage L, thereby achieving an uniform cooling effect over the entire heat sink H. Additionally, even if the flow amount of the coolant is increased, it is possible to reduce the amount of fluid leaking from the coolant passage L without generating a partial high-pressure portion. Moreover, the structure of the coolant passage L can be simplified.

While the invention has been described with reference to exemplary embodiments thereof, it is to be understood that the invention is not limited to the exemplary embodiments or construction and thus achieved in various modifications and combinations within the spirit and scope of the invention.

What is claimed is:

1. A cooling apparatus for an electric motor control unit, comprising:
    a heat sink contacting a module of an electric motor control unit;
    a concave portion continuously formed in the heat sink; and
    a wall member mounted on an opening face side of the concave portion so as to be fixed to the heat sink, the concave portion and the wall member together defining a coolant passage in the heat sink, wherein
    the heat sink includes a plurality of projections projecting from a mounting surface with respect to the wall member;
    the wall member includes a plurality of holes, a hole fitted onto each projection; and
    the wall member fixed to the heat sink by press-fitting the projection of the heat sink.

2. The cooling apparatus for the electric motor control unit according to claim 1, wherein the concave portion is a race that winds so as to extend over an entire practical area of the heat sink.

3. The cooling apparatus for the electric motor control unit according to claim 2, wherein a dividing wall, a height of which from a bottom of the race is shorter than a depth of the race, is provided along the race.

4. The cooling apparatus for the electric motor control unit according to claim 3, wherein a contact surface of the heat sink with the module is a surface to which finish machining is applied.

5. The cooling apparatus for the electric motor control unit according to claim 3, wherein the heat sink is fixed on a driving device case of a driving device, for a vehicle including an electric motor, at a predetermined distance to define a return passage of a coolant between the driving device case and the wall member of the heat sink.

6. The cooling apparatus for the electric motor control unit according to claim 2, wherein a contact surface of the heat sink with the module is a surface to which finish machining is applied.

7. The cooling apparatus for the electric motor control unit according to claim 2, wherein the heat sink is fixed on a driving device case of a driving device, for a vehicle including an electric motor, at a predetermined distance to define a return passage of a coolant between the driving device case and the wall member of the heat sink.

8. The cooling apparatus for the electric motor control unit according to claim 1, wherein the concave portion is structured from a space between a plurality of pin-like fins rising from a bottom portion of the heat sink.

9. The cooling apparatus for the electric motor control unit according to claim 8, wherein the plurality of pin-like fins are evenly arranged over an entire practical surface of the heat sink.

10. The cooling apparatus for the electric motor control unit according to claim 9, wherein a part of the plurality of pin-like fins each have a projection of the plurality of projections at a tip thereof.

11. The cooling apparatus for the electric motor control unit according to claim 9, wherein a contact surface of the heat sink with the module is a surface to which finish machining is applied.

12. The cooling apparatus for the electric motor control unit according to claim 9, wherein the heat sink is fixed on a driving device case of a driving device, for a vehicle including an electric motor, at a predetermined distance to define a return passage of a coolant between the driving device case and the wall member of the heat sink.

13. The cooling apparatus for the electric motor control unit according to claim 8, wherein a part of the plurality of pin-like fins each have a projection of the plurality of projections at a tip thereof.

14. The cooling apparatus for the electric motor control unit according to claim 13, wherein a contact surface of the heat sink with the module is a surface to which finish machining is applied.

15. The cooling apparatus for the electric motor control unit according to claim 13, wherein the heat sink is fixed on a driving device case of a driving device, for a vehicle including an electric motor, at a predetermined distance to define a return passage of a coolant between the driving device case and the wall member of the heat sink.

16. The cooling apparatus for the electric motor control unit according to claim 8, wherein a contact surface of the heat sink with the module is a surface to which finish machining is applied.

17. The cooling apparatus for the electric motor control unit according to claim 8, wherein the heat sink is fixed on a driving device case of a driving device, for a vehicle including an electric motor, at a predetermined distance to define a return passage of a coolant between the driving device case and the wall member of the heat sink.

18. The cooling apparatus for the electric motor control unit according to claim 1, wherein a contact surface of the heat sink with the module is a surface to which finish machining is applied.

19. The cooling apparatus for the electric motor control unit according to claim 18, wherein the heat sink is fixed on a driving device case of a driving device, for a vehicle including an electric motor, at a predetermined distance to define a return passage of a coolant between the driving device case and the wall member of the heat sink.

20. The cooling apparatus for the electric motor control unit according to claim 1, wherein the heat sink is fixed on a driving device case of a driving device, for a vehicle including an electric motor, at a predetermined distance to define a return passage of a coolant between the driving device case and the wall member of the heat sink.

* * * * *